(12) United States Patent
Lou et al.

(10) Patent No.: US 8,021,563 B2
(45) Date of Patent: *Sep. 20, 2011

(54) ETCH DEPTH DETERMINATION FOR SGT TECHNOLOGY

(75) Inventors: Yingying Lou, Shanghai (CN); Tiesheng Li, San Jose, CA (US); Yu Wang, Fremont, CA (US); Anup Bhalla, Santa Clara, CA (US)

(73) Assignee: Alpha & Omega Semiconductor, Ltd, Hamilton (BM)

( * ) Notice: Subject to any disclaimer, the term of this patent is extended or adjusted under 35 U.S.C. 154(b) by 1215 days.

This patent is subject to a terminal disclaimer.

(21) Appl. No.: 11/690,546

(22) Filed: Mar. 23, 2007

(65) Prior Publication Data
US 2008/0233748 A1    Sep. 25, 2008

(51) Int. Cl.
*H01L 21/302*    (2006.01)
(52) U.S. Cl. .............. 216/59; 216/60; 438/5; 438/8; 438/14; 438/16
(58) Field of Classification Search .............. None
See application file for complete search history.

(56) References Cited

U.S. PATENT DOCUMENTS

| | | | | |
|---|---|---|---|---|
| 4,039,370 A * | 8/1977 | Kleinknecht | ................ | 438/16 |
| 5,126,807 A | 6/1992 | Baba et al. | ................ | 257/401 |
| 5,242,845 A | 9/1993 | Baba et al. | ................ | 438/243 |
| 5,260,227 A | 11/1993 | Farb et al. | ................ | 438/192 |
| 5,283,201 A | 2/1994 | Tsang et al. | ................ | 438/138 |
| 5,578,508 A | 11/1996 | Baba et al. | ................ | 438/270 |
| 5,648,283 A | 7/1997 | Tsang et al. | ................ | 438/138 |
| 5,801,417 A | 9/1998 | Tsang et al. | ................ | 257/333 |
| 5,998,833 A | 12/1999 | Baliga | ................ | 257/329 |
| 6,030,903 A * | 2/2000 | Glogovsky | ................ | 438/738 |
| 6,177,285 B1 * | 1/2001 | Jantke et al. | ................ | 438/14 |
| 6,388,286 B1 | 5/2002 | Baliga | ................ | 257/330 |

(Continued)

FOREIGN PATENT DOCUMENTS
JP    63-296282 A    12/1988

OTHER PUBLICATIONS
Office Action Mailed Apr. 28, 2008 for U.S. Appl. No. 11/690,581.

(Continued)

*Primary Examiner* — Anita Alanko
(74) *Attorney, Agent, or Firm* — Joshua D. Isenberg; JDI Patent

(57) ABSTRACT

A method for determining the depth etch, a method of forming a shielded gate trench (SGT) structure and a semiconductor device wafer are disclosed. A material layer is formed over part of a substrate having a trench. The material fills the trench. A resist mask is placed over a test portion of the layer of material. The resist mask does not cover the trench. The layer of material is isotropically etched. An etch depth may be determined from a characteristic of etching of the material underneath the mask. Such a method may be used for forming SGT structures. The wafer may comprise a layer of material disposed on at least a portion of a surface of semiconductor wafer; a resist mask comprising an angle-shaped test portion disposed over a portion of the layer of material; and a ruler marking on the surface of the substrate proximate the test portion.

19 Claims, 3 Drawing Sheets

U.S. PATENT DOCUMENTS

| | | | |
|---|---|---|---|
| 6,545,316 B1 | 4/2003 | Baliga | 257/329 |
| 6,573,559 B2 | 6/2003 | Kitada et al. | 257/330 |
| 6,621,121 B2 | 9/2003 | Baliga | 257/330 |
| 6,677,641 B2 | 1/2004 | Kocon | 257/329 |
| 6,683,346 B2 | 1/2004 | Zeng | 257/330 |
| 6,690,062 B2 | 2/2004 | Henninger et al. | 257/340 |
| 6,706,615 B2 | 3/2004 | Kitada et al. | 438/430 |
| 6,764,889 B2 | 7/2004 | Baliga | 438/197 |
| 6,870,220 B2 | 3/2005 | Kocon et al. | 257/340 |
| 6,891,223 B2 | 5/2005 | Krumrey et al. | 257/330 |
| 7,098,500 B2 | 8/2006 | Zeng | 257/302 |
| 7,372,072 B2 | 5/2008 | Winter et al. | |
| 7,521,332 B2 * | 4/2009 | Li et al. | 438/426 |
| 7,795,108 B2 | 9/2010 | Li et al. | |
| 2003/0045068 A1 | 3/2003 | Gutsche et al. | 438/386 |
| 2004/0256665 A1 | 12/2004 | Birner et al. | 257/329 |
| 2005/0118775 A1 | 6/2005 | Goldbach et al. | 438/386 |
| 2005/0161749 A1 | 7/2005 | Yang et al. | 257/414 |
| 2006/0157700 A1 | 7/2006 | Winter et al. | |
| 2007/0032089 A1 | 2/2007 | Nuzzo et al. | 438/725 |
| 2007/0269726 A1 * | 11/2007 | Konishi et al. | 430/5 |
| 2008/0057671 A1 | 3/2008 | Furukawa et al. | 438/426 |

OTHER PUBLICATIONS

U.S. Appl. No. 11/690,581, entitled "Resistance-Based Etch Depth Determination for SGT Technology", Tiesheng Li et al, filed Mar. 23, 2007.

Notice of Allowance and Fee(s) Due dated Dec. 10, 2008 issued for U.S. Appl. No. 11/690,581.

Office Action dated Oct. 2, 2009 issued for U.S. Appl. No. 12/399,632.

Notice of Allowance and Fee(s) Due dated May 12, 2010 issued for U.S. Appl. No. 12/399,632.

* cited by examiner

ETCH DEPTH DETERMINATION FOR SGT TECHNOLOGY

CROSS-REFERENCE TO RELATED APPLICATIONS

This application is related to application Ser. No. 11/690,581, to Tiesheng Li, entitled "RESISTANCE-BASED ETCH DEPTH DETERMINATION FOR SGT TECHNOLOGY", filed on Mar. 23, 2007, now U.S. Pat. No. 7,521,332, the entire disclosures of which are incorporated herein by reference.

FIELD OF THE INVENTION

This invention generally relates to semiconductor devices and more particularly to controlling the depth of etch in fabrication of semiconductor devices.

BACKGROUND OF THE INVENTION

MOSFET (metal-oxide-semiconductor field effect transistor) devices have many electrical applications including use in RF/microwave amplifiers. In such applications, the gate to drain feedback capacitance must be minimized in order to maximize RF gain and minimize signal distortion. In a silicon power MOSFET, the gate electrode provides turn-on and turn-off control upon the application of an appropriate gate bias.

Conventional technologies for reducing the gate to drain capacitance $C_{gd}$ in a DMOS device are still confronted with technical limitations and difficulties. Specially, trenched DMOS devices are configured with trenched gates wherein large capacitance ($C_{gd}$) between gate and drain limits the device switching speed. The capacitance is mainly generated from the electrical field coupling between the bottom of the trenched gate and the drain. In order to reduce the gate to drain capacitance, an improved Shielded Gate Trench (SGT) structure is introduces at the bottom of the trenched gate to shield the trenched gate from the drain.

U.S. Pat. Nos. 5,126,807 and 5,998,833 illustrate examples of shielded gate trench (SGT) MOSFET as a promising solution in high speed switching applications with the SGT function as a floating gate in the lower part of the trench or fix to a source voltage. However, a challenge of the processes disclosed in the above-mentioned references is to control the depth of the floating gate in order to avoid the malfunction of the MOSFET. Control of etch depth is particularly important, e.g. when etching back polysilicon to the middle of the gate trench because this is not an end point etch. As the feature sizes continue to shrink floating gate etch control becomes a more challenging and important task.

A common prior art technique for controlling etch depth, referred to herein as time control, involves control of the etch duration. In this technique an etch rate is determined and the etch depth may be calculated by timing the etch process and multiplying the etch rate by the etch duration. Unfortunately, the etching rate for polysilicon highly depends on numerous factors including, e.g., polysilicon grain size, doping, trench size and overall loading effect. Thus, the etch rate for polysilicon can be difficult to determine.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1A:
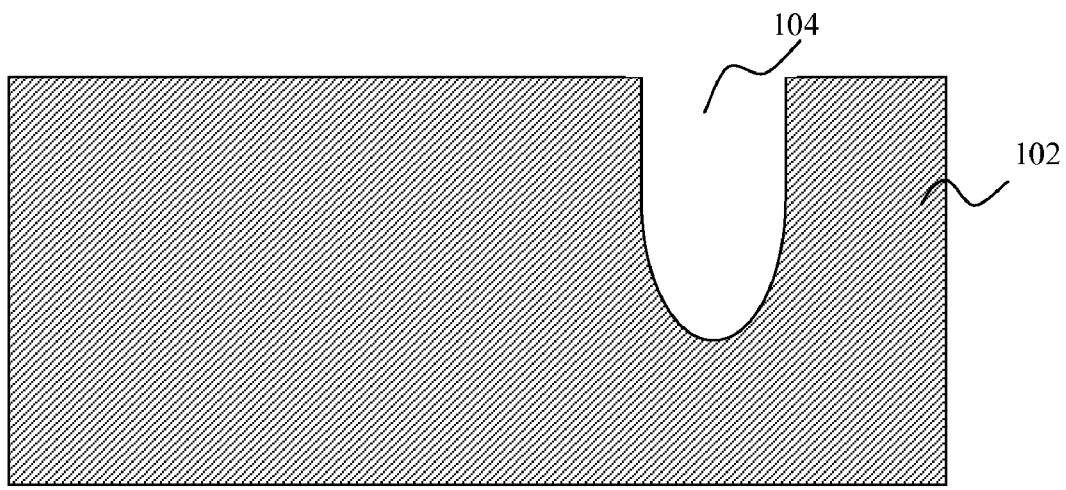
FIG. 1A is a cross sectional view illustrating part of a process for fabricating a SGT floating gate at a lower portion of a trench according to an embodiment of the present invention.
Figure 1B:
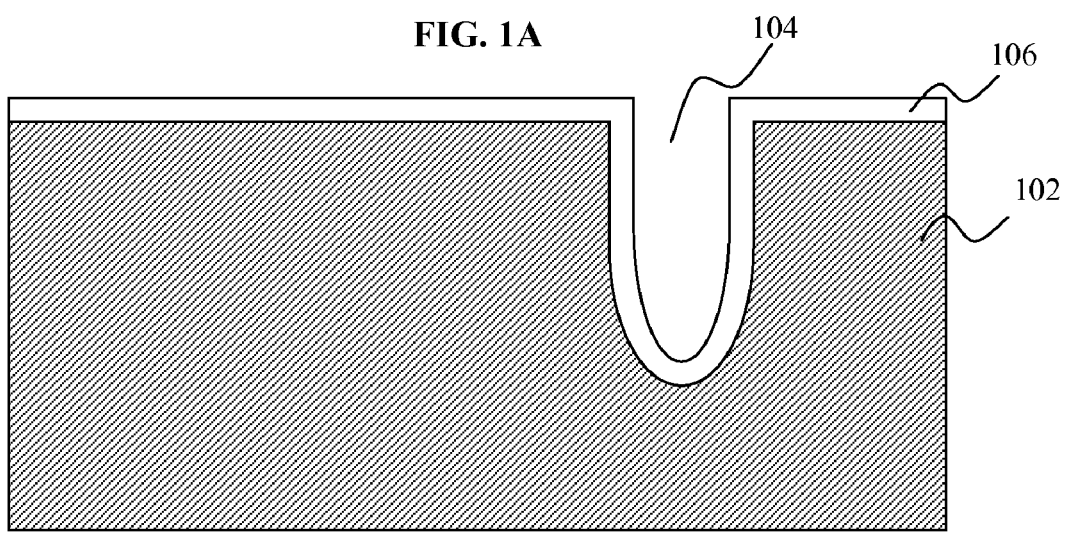
FIG. 1B is a cross sectional view illustrating another part of a process for fabricating a SGT floating gate at a lower portion of a trench according to an embodiment of the present invention.

FIGS. 1A-1E are cross sectional views illustrating a method of making a shielded gate trench (SGT) structure and determining etch depth according to an embodiment of the present invention. As shown in FIG. 1A, a trench 104 is etched into a semiconductor layer 102, such as a silicon layer, by an anisotropic etching technique such as an RIE using a trench mask (not shown). By way of example, the trench 104 may be between about 0.3 and about 1 microns wide and between about 1 and about 3 microns deep. An electrical insulating layer 106, such as silicon oxide film, is formed over the material including the inside of the trench 104 using a thermal oxidation technique as shown in FIG. 1B.

Figure 1C:
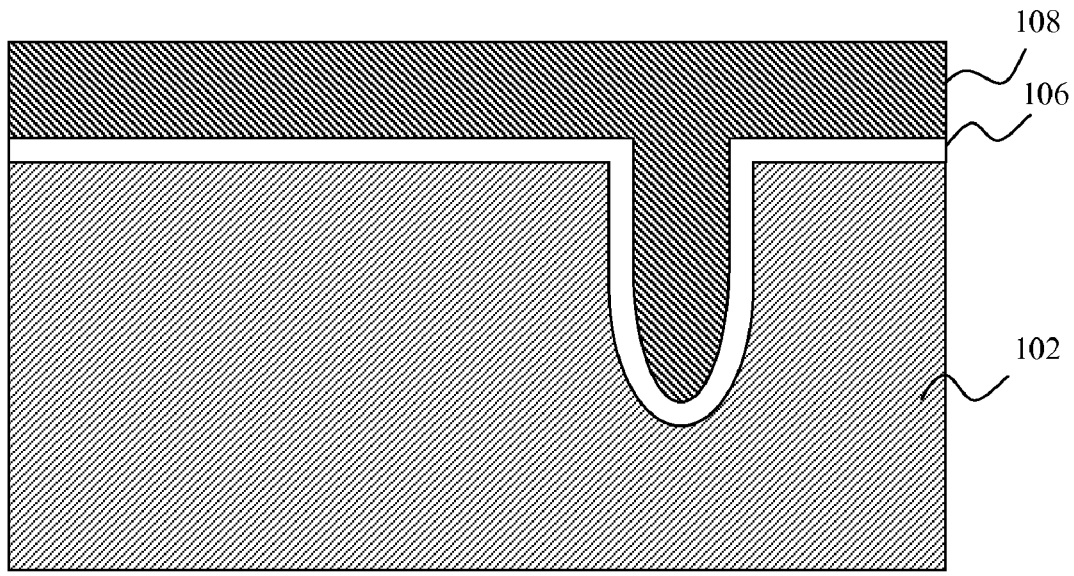
FIG. 1C is a cross sectional view illustrating another part of a process for fabricating a SGT floating gate at a lower portion of a trench according to an embodiment of the present invention.
Figure 1D:
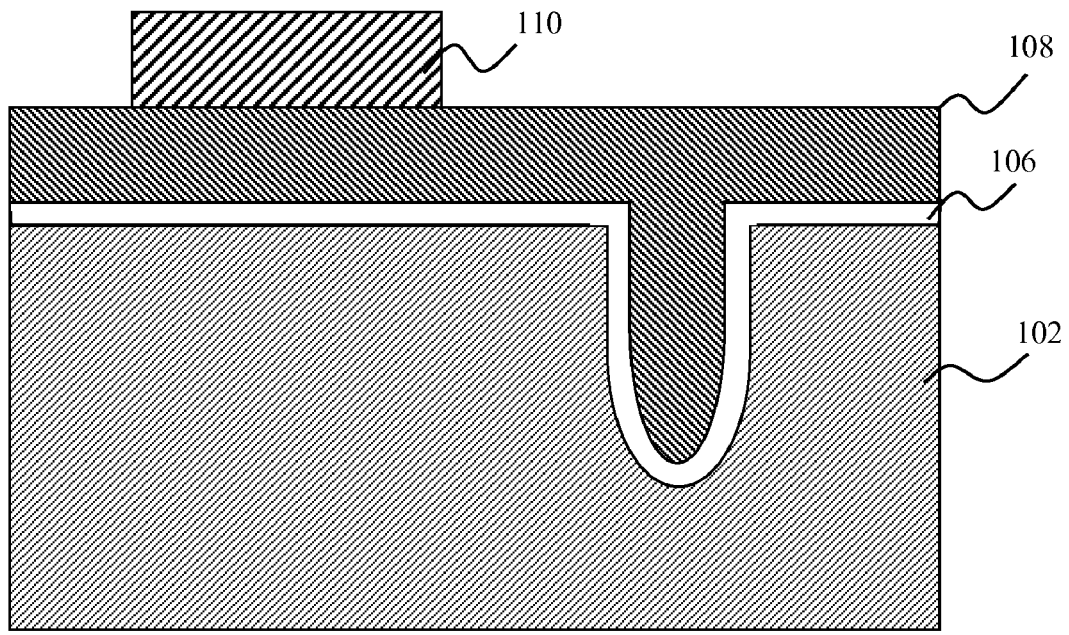
FIG. 1D is a cross sectional view illustrating another part of a process for fabricating a SGT floating gate at a lower portion of a trench according to an embodiment of the present invention.

In FIG. 1C, a layer of material 108 is formed on the substrate. The trench 104 is filled by the material 108. By way of example, the material 108 may be polysilicon, which may be deposited, e.g., using a low pressure chemical vapor deposition (LPCVD) technique. A mask 110 is placed over a portion of the material layer 108. The mask 110 may be made of a layer of material, such as a photoresist or other resist, that develops upon exposure to light, radiation or charged particles. When developed, portions of the resist may be resistant to a process that etches the material layer 108. Preferably, the mask 110 does not cover the trench 104. The layer of material forming the mask 110 may include a portion proximate to the trench 104 as shown in FIG. 1D. A test portion 109 of the material layer 108 lies underneath the mask 110. The mask 110 may be made of a transparent material to facilitate measurement of a length of the test portion 109 underneath the mask. In addition to using photoresist or other resist to form a soft mask, a transparent dielectric layer such as silicon oxide material may be deposited overlaying the material 108 and then patterned with a soft mask to form a hard mask.

Figure 1E:
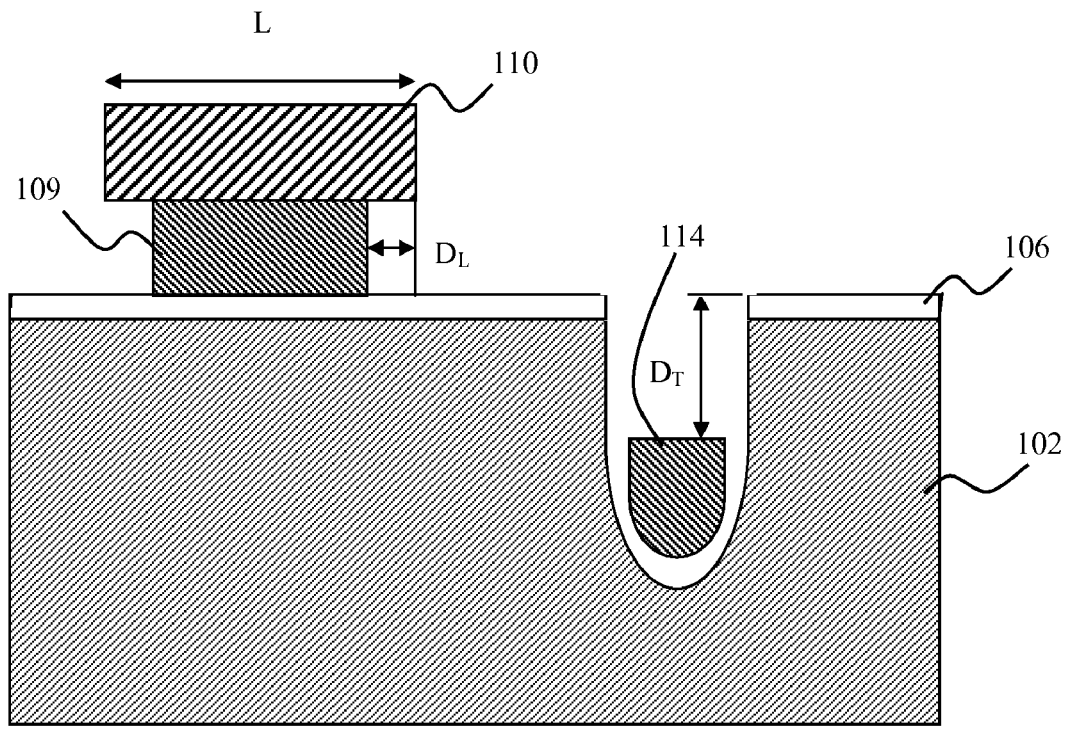
FIG. 1E is a cross sectional view illustrating another part of a process for fabricating a SGT floating gate at a lower portion of a trench according to an embodiment of the present invention.

The material layer 108 may be isotropically etched back to a desired depth $D_T$ inside the trench 104 to form a shielding gate electrode 114 as shown in FIG. 1E. As the material 108 in the trench 104 is etched vertically to a depth $D_T$, the polysilicon under the mask 110 is undercut by an amount $D_L$. In embodiments of the present invention the depth $D_T$ may be determined by monitoring the lateral undercut $D_L$. The lateral undercut $D_L$ may be related to the trench depth $D_T$ according to a function $F(D_L)$ such that:

$$D_T = F(D_L) \quad (1)$$

The trench depth $D_T$ may be determined as long as $D_L$ data is available and a relationship between $D_T$ and $D_L$ is known. The function $F(D_L)$ relating $D_T$ and $D_L$ may be determined experimentally. For example, a test may be performed with trenches of different known depths filled with the material 108. Lateral undercut $D_L$ may be measured when the etch depth $D_T$ reaches the bottom of each trench. The function $F(D_L)$ may be determined from the measured values of $D_L$ and the known depths of the trenches.

Figure 1F:
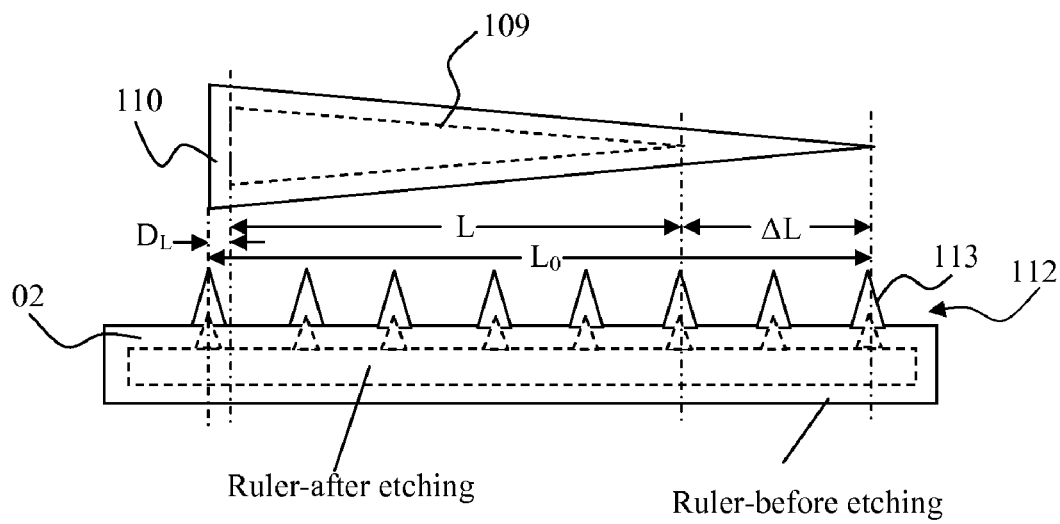
FIG. 1F is top view of a test structure and ruler that may be used in accordance with a method for determining etch depth according to an embodiment of the present invention.

A marking ruler 112 may be formed by a portion of material 108 underneath part of the mask 110 to facilitate measurement of a length L of the test portion 109. By way of example, the ruler 112 may comprise a series of regularly spaced substantially parallel features 113, such as teeth or triangles. As illustrated in FIG. 1F, which shows a top view of the structure, the ruler formed by the material 108 under the ruler mask also experiences under cut etch, but the lateral locations of ruler markings 113 remain the same. Alternatively, the ruler may be formed along the trench at the same time the trench is formed by integrating the ruler onto the trench mask. In this case the mask 110 only covers the test structure portion 109 as the ruler is already etched into the substrate and is not affected by the subsequent poly etch back. The ruler 112 helps continuously and precisely measure a length of a portion 109 of material layer 108 that lies under the mask 110 during the etch back process.

Direct reading of $D_L$ may be difficult and subject to error if $D_L$ is relatively small. To make the undercut $D_L$ somewhat easier to measure, the mask 110 may include a feature characterized by a shape with a sharp angle θ proximate a ruler 112. By way of example, and without loss of generality, the mask 110 may have a dagger shape or may include a dagger shaped portion with a length $L_0$ that lies alongside with the ruler 112, as shown in FIG. 1F. Alternatively, the mask 110 (or a portion thereof) may have a circular shape, a chevron shape or dagger shape such as triangle shape. The solid lines indicate the shape of the mask 110. The dashed lines indicate the shape of the test portion 109 after etching the material 108 for some period of time. As the lateral undercut attacks the sides of the test portion 109 under the dagger shaped mask 110, the length of the test portion 109 changes. If the tip angle θ is sufficiently sharp, a relatively small amount of undercut $D_L$ can cause a significant and readily measurable change in the length of the material layer 108 underneath the dagger shaped portion. The amount of lateral undercut $D_L$ may be approximated by the following formula:

$$D_L \approx \Delta L \times \tan \theta/2$$

Where $\Delta L$ is a measured length change of the test portion 109 underneath the dagger shaped portion of the mask 110 after etching and θ is the tip angle of the dagger shape. If the tip angle θ is sufficiently small, a small amount of lateral etching $D_L$ can produce a relatively large and very measurable length change $\Delta L$ in the test portion 109, which may be easily and accurately read with the help of the ruler markings 113.

Figure 2:
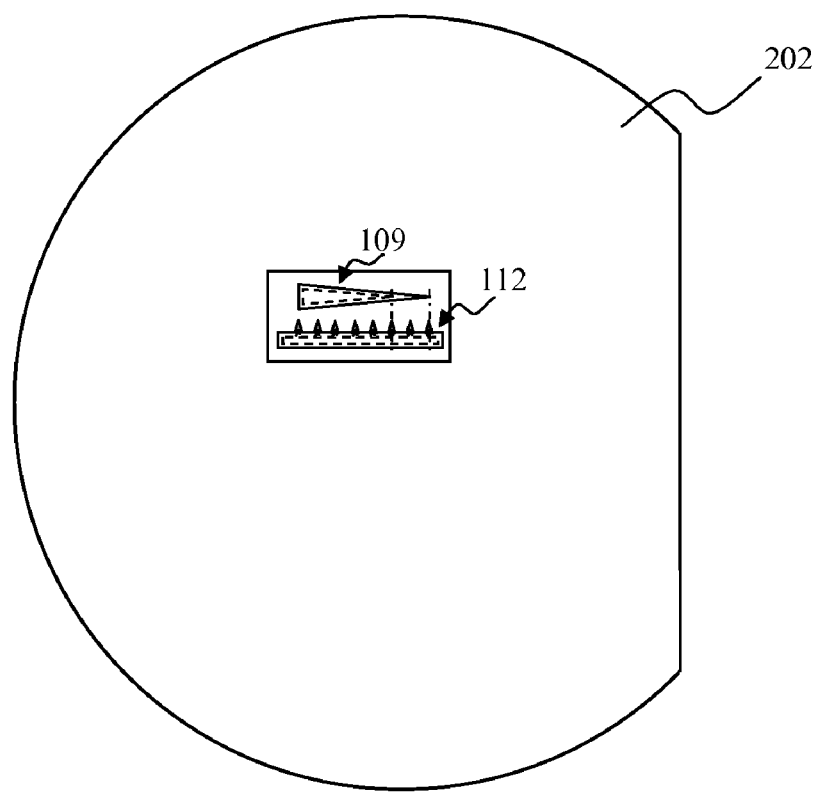
FIG. 2 is a top view of a semiconductor wafer with test structure and ruler at an intermediate stage of the manufacturing process according to an embodiment of the present invention.

The dagger shape structure and the marking ruler may be employed in semiconductor wafers at an intermediate step of the semiconductor manufacturing process, and is preferably constructed in a testing area as a test structure to verify critical dimensions (CD) of device manufacture process. FIG. 2 is a top view illustrating a wafer 202 having a dagger shape structure 109 and a marking ruler 112 in a CD testing area. The dagger shaped test structure 109 includes a layer of material disposed on at least a portion of a surface of semiconductor wafer 202 patterned by mask 110 having a dagger shaped test portion disposed over a portion of the layer of material. The ruler 112 proximate the test portion to facilitate measurement of the length L of the test portion. The dagger shape structure 109 is formed by the same process as the active device forming trench bottom shielding electrode, except additional masking process is applied to the test structure. The wafer 202 with the dagger shape structure 109 and a marking ruler 112 may be used in an intermediate step of a semiconductor device fabrication process where a depth of etching in trench structures formed in wafer 202 needs to be precisely controlled. Mask 110 may be stripped off at the end of etch back process or remained in case a hard mask is used. In any case, it is preferable that the tip of mask 110 is aligned with a specific tee of the ruler so that the tip of the mask can be identified even after the mask is removed.

Embodiments of the present invention allow for more precise real-time determination of etch depth in a simple and straightforward manner. The dagger shape structure combining the marking ruler also provides a tool to verify the precision control of the polysilicon etch back process.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for determining etch depth, comprising:
    a) forming a layer of material over a portion of a substrate having a trench formed thereon in such a way that the material fills the trench;
    b) placing a mask over a test portion of the layer of material, wherein the mask does not cover the trench;
    c) isotropically etching the layer of material;
    d) determining a depth $D_T$ of etching of the material in the trench based on a characteristic of etching of the material underneath a portion of the mask, wherein the characteristic of etching is an amount of lateral undercut $D_L$ of the test portion underneath the mask.

2. The method of claim 1 wherein d) comprises:
    measuring the amount of lateral undercut $D_L$; and
    determining the depth of etched length of the material in the trench from the amount of undercut $D_L$.

3. The method of claim 2 wherein the mask comprises a rectangular shape.

4. The method of claim 2, wherein the mask comprises a circular shape.

5. The method of claim 2 wherein the mask comprises a portion having an angled shape having a tip angle $\theta$.

6. The method of claim 5 wherein the mask over the test portion comprises a chevron shape.

7. The method of claim 5, wherein the mask over the test portion comprises a triangular or dagger shape.

8. The method of claim 5 wherein measuring the amount of lateral undercut $D_L$ comprises measuring a change in length $\Delta L$ of the test portion and determining the amount of lateral undercut $D_L$ from the change in length $\Delta L$.

9. The method of claim 8, further comprising:
e) forming a marking ruler proximate the test portion, wherein the ruler is adapted to facilitate measurement of the change length $\Delta L$ of the test portion.

10. The method of claim 8 wherein determining the amount of lateral undercut $D_L$ from the change in length $\Delta L$ comprises approximating the amount of undercut $D_L$ as $D_L \approx \Delta L \times \tan \theta/2$.

11. The method of claim 2 wherein the mask is made of a transparent material.

12. The method of claim 11 wherein the transparent material comprises a transparent oxide material.

13. The method of claim 2 wherein the layer of material comprises a layer of polysilicon.

14. A method of forming a shielded gate trench (SGT) structure, comprising:

a) filling a trench with polysilicon wherein a polysilicon film is formed over the trench;
b) placing a mask over a portion of the polysilicon;
c) isotropically etching the polysilicon;
d) determining a depth of etching of the polysilicon in the trench based on a characteristic of etching of the polysilicon portion underneath the mask, wherein the characteristic of etching is an amount of lateral undercut $D_L$ of the test portion underneath the mask.

15. The method of claim 14, wherein d) comprises:
measuring the amount of lateral undercut $D_L$; and
determining the depth of etched length of the polysilicon in the trench from the amount of undercut $D_L$.

16. The method of claim 15 wherein the mask comprises a layer of material having an angled shape test portion having a tip angle $\theta$.

17. The method of claim 16 wherein measuring the amount of lateral undercut $D_L$ comprises measuring a change in length $\Delta L$ of the test portion and determining the amount of lateral undercut $D_L$ from the change in length $\Delta L$.

18. The method of claim 17, further comprising:
e) placing a marking ruler proximate the test portion, wherein the ruler is adapted to facilitate measurement of the change in length $\Delta L$ of the test portion.

19. The method of claim 17 wherein determining the amount of lateral undercut $D_L$ from the change in length $\Delta L$ comprises approximating the amount of undercut $D_L$ as $D_L \approx \Delta L \times \tan \theta/2$.

* * * * *